US011226353B2

United States Patent
Hu et al.

(10) Patent No.: US 11,226,353 B2
(45) Date of Patent: Jan. 18, 2022

(54) INTEGRATED CABLE PROBE DESIGN FOR HIGH BANDWIDTH RF TESTING

(71) Applicant: Intel Corporation, Santa Clara, CA (US)

(72) Inventors: Chengqing Hu, Chandler, AZ (US); Mayue Xie, Phoenix, AZ (US); Simranjit S. Khalsa, Chandler, AZ (US); Deepak Goyal, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 93 days.

(21) Appl. No.: 16/493,503

(22) PCT Filed: Mar. 31, 2017

(86) PCT No.: PCT/US2017/025456
§ 371 (c)(1),
(2) Date: Sep. 12, 2019

(87) PCT Pub. No.: WO2018/182703
PCT Pub. Date: Oct. 4, 2018

(65) Prior Publication Data
US 2021/0132113 A1   May 6, 2021

(51) Int. Cl.
*G01R 1/04* (2006.01)
*G01R 1/067* (2006.01)
(Continued)

(52) U.S. Cl.
CPC ..... *G01R 1/06772* (2013.01); *G01R 31/2822* (2013.01)

(58) Field of Classification Search
CPC ................ G01R 31/02; G01R 31/0404; G01R 31/0416; G01R 31/067; G01R 31/06766;
(Continued)

(56) References Cited

U.S. PATENT DOCUMENTS 3,281,756 A * 10/1966 O'Keefe .............. H01R 13/648
439/320
6,734,689 B1 * 5/2004 Yang .................. G01R 1/06772
324/755.02
(Continued)

FOREIGN PATENT DOCUMENTS

WO    WO-2018182703 A1    10/2018

OTHER PUBLICATIONS

"International Application Serial No. PCT US2017 025456, International Preliminary Report on Patentability dated Oct. 10, 2019", 11 pgs.
(Continued)

*Primary Examiner* — Neel D Shah
(74) *Attorney, Agent, or Firm* — Schwegman Lundberg & Woessner, P.A.

(57) ABSTRACT

An electrical characterization and fault isolation probe can include a cable, a connector, and a coating over a portion of the cable. The cable can have a first conductor having a first impedance, a second conductor having a second impedance, and a dielectric surrounding the first conductor and electrically isolating the first conductor from the second conductor. The connector can physically couple to, and be in electrical communication with, the cable. The connector can include a first electrical communication pathway and a second electrical communication pathway. The first electrical communication pathway can be electrically isolated from the second electrical communication pathway. The first electrical communication pathway can be in electrical communication with the first conductor. The second electrical communication pathway can be in electrical communication with the second conductor. The connector can have a fifth impedance.

21 Claims, 5 Drawing Sheets

(51) Int. Cl.
*G01R 1/073* (2006.01)
*G01R 31/11* (2006.01)
*G01R 31/28* (2006.01)

(58) Field of Classification Search
CPC ........ G01R 31/06772; G01R 31/06788; G01R 31/07342; G01R 31/073; G01R 31/11; G01R 31/28; G01R 31/2822; G01R 1/04; G01R 1/06; G01R 1/067; G01R 1/073
See application file for complete search history.

(56) References Cited

U.S. PATENT DOCUMENTS

| | | | |
|---|---|---|---|
| 10,244,408 B1* | 3/2019 | Vannucci | H01Q 1/246 |
| 2003/0208734 A1 | 11/2003 | Jefferson, Jr. et al. | |
| 2003/0218463 A1* | 11/2003 | Stierman | G01R 31/11 |
| | | | 324/534 |
| 2015/0212140 A1* | 7/2015 | Lawrence | G01R 31/50 |
| | | | 324/509 |
| 2015/0323566 A1 | 11/2015 | Jan | |

OTHER PUBLICATIONS

"International Application Serial No. PCT/US2017/025456, International Search Report dated Aug. 23, 2017", 3 pgs.
"International Application Serial No. PCT/US2017/025456, Written Opinion dated Aug. 23, 2017", 9 pgs.

* cited by examiner

INTEGRATED CABLE PROBE DESIGN FOR HIGH BANDWIDTH RF TESTING

This application is a U.S. National Stage Application under 35 U.S.C. 371 from International Application No. PCT/US2017/025456, filed Mar. 31, 2017, which is hereby incorporated by reference in its entirety.

BACKGROUND

A high frequency electrical characterization and fault isolation system can include electrical components (e.g., a signal generator, a signal detector, or a signal processing unit), non-electrical/mechanical components (e.g., an optical microscope, a probe station, or a vacuum system), as well as accessories (e.g., cables, adaptors, or probes).

SUMMARY

The present inventors have recognized, among other things, that a problem to be solved can include reducing the number of components required to perform electrical characterization and fault isolation. The present inventors have recognized, among other things, that a problem to be solved can also include reducing impedance mismatch between electrical characterization and fault isolation system components. The present inventors have recognized, among other things, that a problem to be solved can further include reducing the costs associated with operating and maintaining an electrical characterization and fault isolation system. The present inventors have recognized, among other things, that a problem to be solved can still further include improving the ergonomic characteristics of an electrical characterization and fault isolation probe.

The present subject matter can help provide a solution to this problem, such as by providing an electrical characterization and fault isolation probe (hereinafter "the probe"). The probe can reduce the number of components needed to test devices, thereby reducing potential impedance mismatches. The probe can reduce the number of components needed to test devices, thereby reducing manufacturing and operating costs. The probe can have a pen-like form factor, thereby providing a more ergonomic device to use, such as by making it easier for an individual to handle and operate the probe (e.g., for an individual to hold the probe and test devices).

Aspect 1 can include or use subject matter (such as an apparatus, a system, a device, a method, a means for performing acts, or a device readable medium including instructions that, when performed by the device, can cause the device to perform acts), such as can include or use a cable, a connector, or a coating. The cable can include first and second ends. The cable can have a first conductor having a first impedance. The cable can have a second conductor having a second impedance. The cable can have a dielectric sheathing the first conductor and electrically isolating the first conductor from the second conductor. The connector can be physically coupled to, and in electrical communication with, the cable. The connector can include a first electrical communication pathway and a second electrical communication pathway. The first electrical communication pathway can be electrically isolated from the second electrical communication pathway. The first electrical communication pathway can be in electrical communication with the first conductor. The second electrical communication pathway can be in electrical communication with the second conductor. The connector can have a third impedance. The coating can be over a portion of the cable. The coating can extend from the first end of the cable toward the second end of the cable.

Aspect 2 can include or use, or can optionally be combined with the subject matter of Aspect 1, to optionally include or use a third conductor. The third conductor can be configured to be physically compliant and coupled to the second conductor. The third conductor can have a fourth impedance.

Aspect 3 can include or use, or can optionally be combined with the subject matter of one or any combination of Aspects 1 or 2 to optionally include or use that the first impedance, second impedance, third impedance, and the fourth impedance can be equal.

Aspect 4 can include or use, or can optionally be combined with the subject matter of one or any combination of Aspects 1 through 3 to optionally include or use that the first impedance, second impedance, third impedance, and the fourth impedance can be substantially similar.

Aspect 5 can include or use, or can optionally be combined with the subject matter of one or any combination of Aspects 1 through 4 to optionally include or use that the first conductor and the third conductor are spaced apart at a first pitch.

Aspect 6 can include or use, or can optionally be combined with the subject matter of one or any combination of Aspects 1 through 4 to optionally include or use that the first conductor and the third conductor are spaced apart at a second pitch.

Aspect 7 can include or use, or can optionally be combined with the subject matter of one or any combination of Aspects 1 through 6 to optionally include or use a collar. The collar can be configured to mate with the cable. The collar can include a third conductor configured to be physically compliant and having a fourth impedance. The collar can include a fourth rigid conductor having a fifth impedance. The third conductor and the fourth conductor can be spaced apart at a first pitch. Mating the collar with the cable can establish an electrical communication pathway between the first conductor and the fourth conductor, and the second conductor and the third conductor, respectively.

Aspect 8 can include or use, or can optionally be combined with the subject matter of one or any combination of Aspects 1 through 7 to optionally include or use that the first impedance, second impedance, third impedance, fourth impedance, and the fifth impedance can be equal.

Aspect 9 can include or use, or can optionally be combined with the subject matter of one or any combination of Aspects 1 through 8 to optionally include or use that the first impedance, second impedance, third impedance, fourth impedance, and the fifth impedance can be substantially similar.

Aspect 10 can include or use, or can optionally be combined with the subject matter of one or any combination of Aspects 1 through 9 to optionally include or use that the third conductor and the fourth conductor are spaced apart at a second pitch. The second pitch can be different than the first pitch.

Aspect 11 can include or use, or can optionally be combined with the subject matter of one or any combination of Aspects 1 through 10 to optionally include or use an adaptor. The adaptor can be configured to couple with the collar. The adaptor can include a fifth conductor that can be in electrical communication with the third conductor. The fifth conductor can have a sixth impedance. The adaptor can include a sixth conductor that can be in electrical communication with the fourth conductor. The sixth conductor can have a seventh impedance. The fifth conductor and the sixth conductor can be spaced apart at a second pitch. The second pitch can be different than the first pitch.

Aspect 12 can include or use, or can optionally be combined with the subject matter of one or any combination of Aspects 1 through 10 to optionally include or use that the first impedance, second impedance, third impedance, fourth impedance, fifth impedance, sixth impedance, and the seventh impedance can be equal.

Aspect 13 can include or use, or can optionally be combined with the subject matter of one or any combination of Aspects 1 through 10 to optionally include or use that the first impedance, second impedance, third impedance, fourth impedance, fifth impedance, sixth impedance, and the seventh impedance can be substantially similar.

Aspect 14 can include or use subject matter (such as an apparatus, a system, a device, a method, a means for performing acts, or a device readable medium including instructions that, when performed by the device, can cause the device to perform acts), such as can include or use a cable, a connector, or a coating. The cable can include first and second ends. The cable can include a first conductor having a first impedance. The cable can include a second conductor having a second impedance. The cable can include a dielectric sheathing the first conductor and electrically isolating the first conductor from the second conductor. The connector can be physically coupled to, and in electrical communication with, the cable. The connector can include a first electrical communication pathway and a second electrical communication pathway. The first electrical communication pathway can be electrically isolated from the second electrical communication pathway. The first electrical communication pathway can be in electrical communication with the first conductor. The second electrical communication pathway can be in electrical communication with the second conductor. The connector can have a third impedance. The coating can be over a portion of the cable. The coating can extend from the first end of the cable toward the second end of the cable.

Aspect 15 can include or use, or can optionally be combined with the subject matter of Aspect 14, to optionally include or use that the probe can include a cable, a connector, or a coating. The cable can include first and second ends. The cable can include a first conductor having a first impedance. The cable can include a second conductor having a second impedance. The cable can include a dielectric sheathing the first conductor and electrically isolating the first conductor from the second conductor. The connector can be physically coupled to, and in electrical communication with, the cable. The connector can include a first electrical communication pathway and a second electrical communication pathway. The first electrical communication pathway can be electrically isolated from the second electrical communication pathway. The first electrical communication pathway can be in electrical communication with the first conductor. The second electrical communication pathway can be in electrical communication with the second conductor. The connector can have a third impedance. The coating can be over a portion of the cable. The coating can extend from the first end of the cable toward the second end of the cable.

Aspect 16 can include or use, or can optionally be combined with the subject matter of, or any combination of Aspects 14 or 15, to optionally include or use that the presence or location of the electrical fault is determined by using vector network analysis or time-domain reflectometry.

Aspect 17 can include or use, or can optionally be combined with the subject matter of one or any combination of Aspects 14 through 16 to optionally include or use a device under testing. The probe can be configured to mate with the device and transmit the first signal to the device.

Aspect 18 can include or use, or can optionally be combined with the subject matter of Aspect 17 to optionally include or use that the device can include an embedded multichip interconnect bridge, an interconnect, a via, a semiconductor package, a die, memory, or a processor.

Aspect 19 can include or use, or can optionally be combined with the subject matter of one or any combination of Aspects 14 through 18 to optionally include or use a third conductor. The third conductor can be configured to be physically compliant and coupled to the second conductor. The third conductor can have a fourth impedance.

Aspect 20 can include or use, or can optionally be combined with the subject matter of one or any combination of Aspects 14 through 19 to optionally include or use that the first impedance, second impedance, third impedance, and the fourth impedance can be equal.

Aspect 21 can include or use subject matter (such as an apparatus, a system, a device, a method, a means for performing acts, or a device readable medium including instructions that, when performed by the device, can cause the device to perform acts), such as can include or use a method for using an electrical characterization and fault isolation probe. The method can include placing an electrical characterization and fault isolation probe into communication with a first device under testing. The method can include generating a first signal across a first conductor of the electrical characterization and fault isolation probe, the first signal propagating through the first device under testing such that the first device under testing causes the first signal to become a second signal. The method can include receiving the second signal at a second conductor of the electrical characterization and fault isolation probe.

Aspect 22 can include or use, or can optionally be combined with the subject matter of Aspect 21, to optionally include or use coupling a first collar to the electrical characterization and fault isolation probe. The first collar can be configured to mate with the first device under testing.

Aspect 23 can include or use, or can optionally be combined with the subject matter of one or any combination of Aspects 21 or 22 to optionally include or use decoupling the first collar from the electrical characterization and fault isolation probe. Aspect 23 can include or use, or can optionally be combined with the subject matter of one or any combination of Aspects 21 or 22 to optionally include or use coupling a second collar to the electrical characterization and fault isolation probe, wherein the second collar is configured to mate with a second device under testing.

Each of these non-limiting examples can stand on its own, or can be combined in various permutations or combinations with one or more of the other examples.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
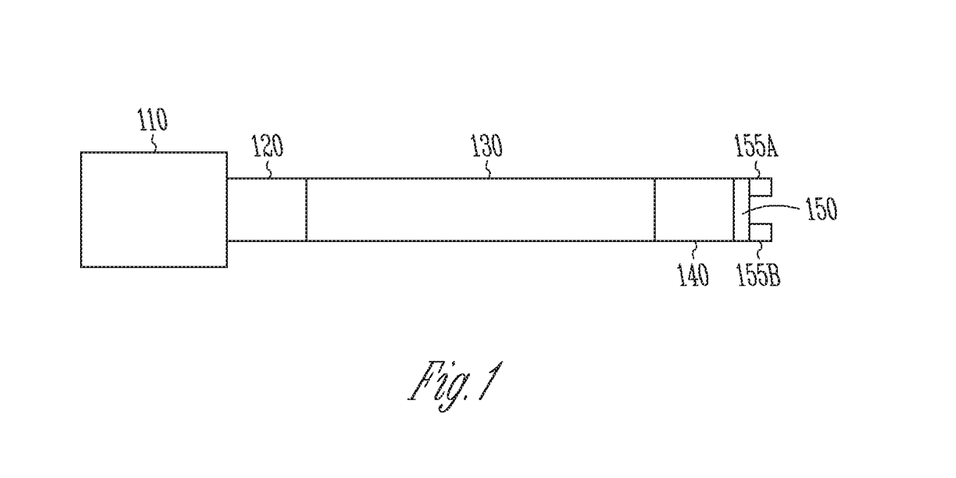
FIG. 1 illustrates a schematic view of an example of an existing electrical characterization and fault isolation system.

FIG. 1 illustrates a schematic view of an example of an existing electrical characterization and fault isolation system 100. The electrical characterization and fault isolation system 100 (hereinafter "the system 100") can include a signal generator 110, a first connector 120, a cable 130, a second connector 140, and a probe tip 150. The probe tip 150 can include a first electrode 155A and a second electrode 155B. The first connector 120 can be used to interconnect (e.g., establish one or more electrical communication pathways between) the signal generator 110 and the cable 130. The second connector 140 can be used to interconnect the cable 130 and the probe tip 150.

The first connector 120, the cable 130, the second connector 140, and the probe tip 150 can each have an impedance. The interfaces between components of the system 100 that have different impedances can cause signal degradation, signal loss, reflections, or the like. The impedance for each of the first connector 120, the cable 130, the second connector 140, and the probe tip 150 can be different. In an example, the different impedances can degrade a signal produced by the signal generator 110 and propagated through the first connector 120, the cable 130, the second connector 140, and the probe tip 150. Signal degradation can affect the accuracy or precision of electrical characterization and fault isolation, such as by providing inaccurate results of tests conducted on a device under testing.

In addition to the opportunity for signal degradation to occur, the components of the system 100 can be expensive or have a short life span. The components of the system 100 can be expensive to manufacture due to the need to minimize impedance mismatch between the components. Additionally, components such as the cable 130 or the probe tip 150, can wear out with repeated use, necessitating the use of expensive replacement parts.

Figure 2:
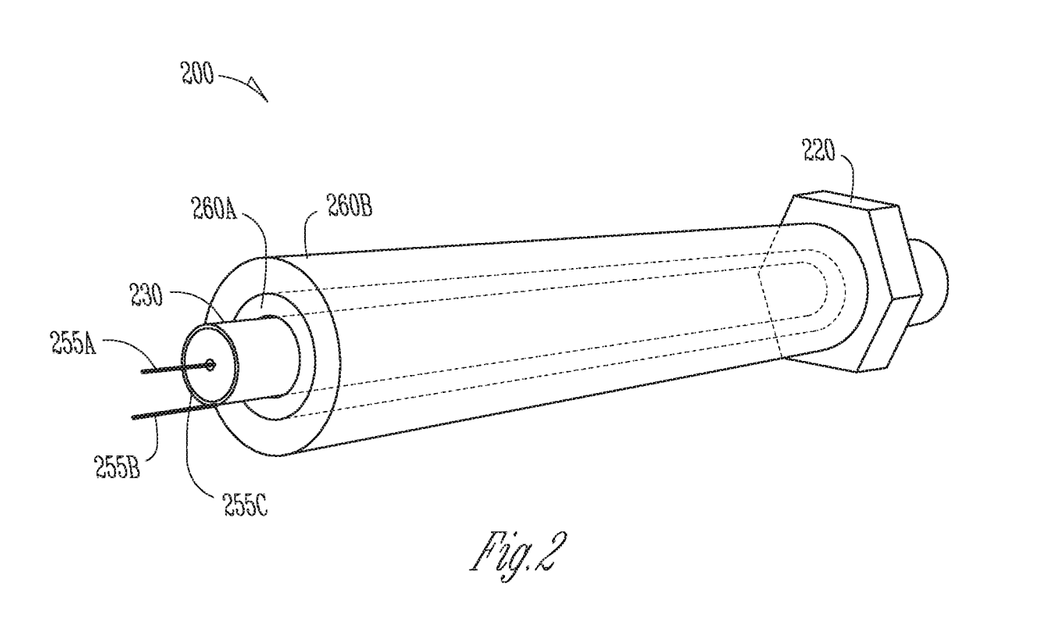
FIG. 2 illustrates a schematic view of an example of an electrical characterization and fault isolation probe according to the present subject matter.

FIG. 2 illustrates a schematic view of an example of an electrical characterization and fault isolation probe 200 according to the present subject matter. The electrical characterization and fault isolation probe 200 (hereinafter "the probe 200") can include a connector 220, a cable 230, a first coating 260A, and a second coating 260B.

The cable 230 can have a first end and a second end. The cable 230 can be a coaxial or triaxial cable, but is not so limited. The cable 230 can include a first conductor 255A, a second conductor 255B, a dielectric portion 255C. The first conductor 255A can be collinear with the longitudinal axis of the cable 230. The first conductor 255A can be a solid wire. The first conductor 255A can be rigid. The first conductor 255A can have a first impedance.

The dielectric portion 255C can sheathe the first conductor 255A, such that the dielectric portion 255C entirely surrounds (e.g., encapsulates) the first conductor 255A. The dielectric portion 255C can electrically insulate the first conductor 255A from the second conductor 255B. The second conductor 255B can include a braided plurality of wires that surround (e.g., sheathe) the dielectric portion 255C. The second conductor 255B can be a grounding braid for a coaxial cable.

The second conductor 255B can be a pin coupled to a grounding braid of a coaxial cable. The second conductor 255B can have a second impedance. The cable 230 can include one or more foil layers (not shown), configured to provide additional shielding of the first conductor 255A from the second conductor 255B, other conductors, or outside electromagnetic interference (e.g., from additional cables, electronic devices, or natural sources). The cable 230 can include insulation coupled to the second conductor 255B configured to electrically insulate (and protect) the cable 230 from external objects.

The first conductor 255A can be the signal conductor for a coaxial cable. The first conductor 255A can be exposed by stripping away the dielectric portion 255C and the second conductor 255B (and any other materials connected therewith). As discussed herein, the second conductor 255B can be a pin coupled to a grounding braid of a coaxial cable. The second conductor 255B can be physically compliant (e.g., able to translate). The second conductor 255B can be spring-loaded such that the second conductor is able to translate in response to an applied force. The first conductor 255A and the second conductor 255B can be spaced at a first pitch (e.g., the first conductor can be located at a first distance from the second conductor 255B). The first pitch can be 400 micrometers. The first conductor 255A and the second conductor 255B can be spaced at a second pitch. The second pitch can be 1 millimeter. The first and second pitches can be less than 400 micrometers. The first and second pitches can be greater than 1 millimeter. The first and second pitches can vary between 400 micrometers and 1 millimeter.

The first coating 260A can be coupled to the cable 230. The first coating 260A can be coupled to a portion of the cable 230. The cable 230 can be flexible. The first coating 260 can increase the rigidity of the cable 230, such as by enclosing the cable 230 in a more rigid or hard material (e.g., plastic or metal). The first coating can increase the diameter of the probe 200. Increasing the diameter of the probe 200 can protect the cable 230 from damage, such as due to bending, crushing, tension, torsion, or the like. Increasing the diameter of the probe 200 can make the probe 200 more ergonomic, such as by making it easier for an individual to handle and operate (e.g., for an individual to hold the probe 200 and test devices) the probe 200.

The second coating 260B can be coupled to the cable 230. The second coating 260B can be coupled to a portion of the cable 230. The second coating 260B can be coupled to the first coating 260A. The second coating 260B can be coupled to a portion of the first coating 260A. The second coating 260B can include a soft (e.g., low durometer) material. The second coating 260B can make the probe 200 more ergonomic by providing a softer surface for an individual to grip, thereby reducing fatigue on the individual. The first coating 260A or the second coating 260B can provide a pen-like gripping surface for the probe 200. Providing a pen-like gripping surface can reduce ergonomic strain on an individual handling the probe 200 by providing a gripping surface that is natural, comfortable, and recognizable; as opposed to an individual attempting to handle a flexible cable that is small in diameter and not rigid. In an example, the cable 130 of FIG. 1 is a small diameter cable (e.g., less than an eighth of an inch). The cable 130 can be fragile and difficult to handle, requiring the system 100 to be fixed to larger equipment (e.g., a rig or the like) in order to effectively operate the system 100. Enclosing the cable 230 in the first coating 260A or the second coating 260B can protect the cable 230 and provide an individual with an object they can easily grasp and manipulate, as compared to the small diameter cable 130.

Figure 4:
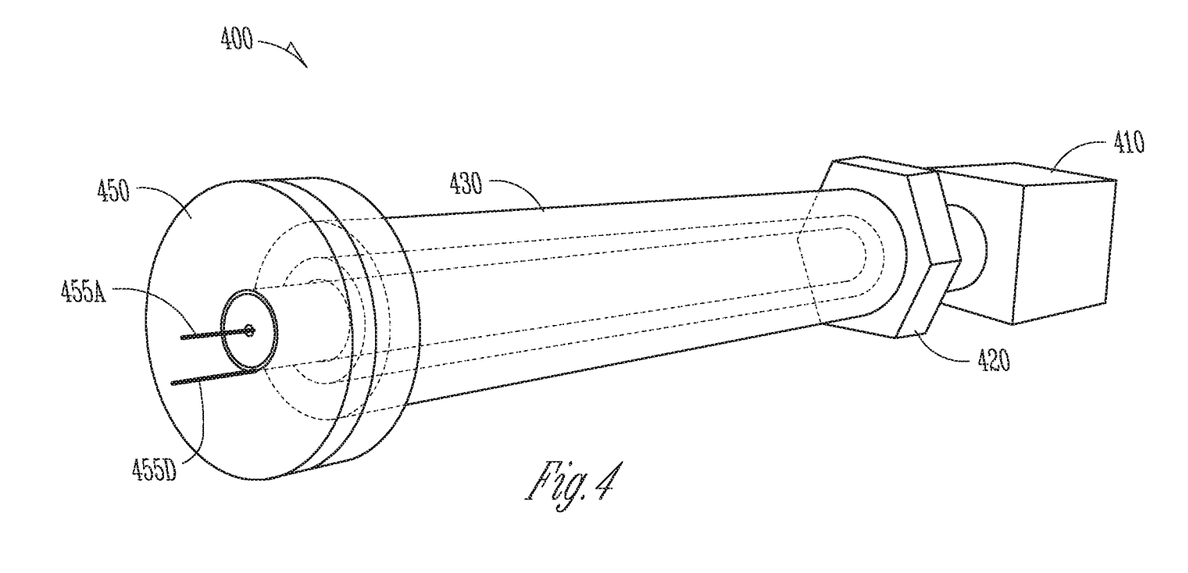
FIG. 4 illustrates a schematic view of an example of an electrical characterization and fault isolation system, including a first collar and a signal generator.

The connector 220 can provide a structurally adequate connection between the cable 230 and additional devices (e.g., the signal generator 410 of FIG. 4). The connector 220 can have a third impedance. The connector 220 can have one or more isolated channels (e.g., electrical communication pathways) for conducting electrical energy to one or more conductors. The one or more isolated channels can have the third impedance. The connector 220 can include a first electrical communication pathway. The connector 220 can include a second electrical communication pathway. The first electrical communication pathway can be electrically isolated from the second electrical communication pathway. The first electrical communication pathway can be in electrical communication with the first conductor 255A. The second electrical communication pathway can be in electrical communication with the second conductor 255B.

The first impedance, the second impedance, and the third impedance can be equal. The first impedance, the second impedance, and the third impedance can be substantially similar (e.g., within 1% of one another). The first impedance, the second impedance, and the third impedance can be similar (e.g., within 5%). Configuring the first impedance, the second impedance, and the third impedance to be equal, substantially similar, or similar can reduce the amount of signal degradation, signal loss, reflections, or the like when the probe 200 is used to test devices.

Figure 3:
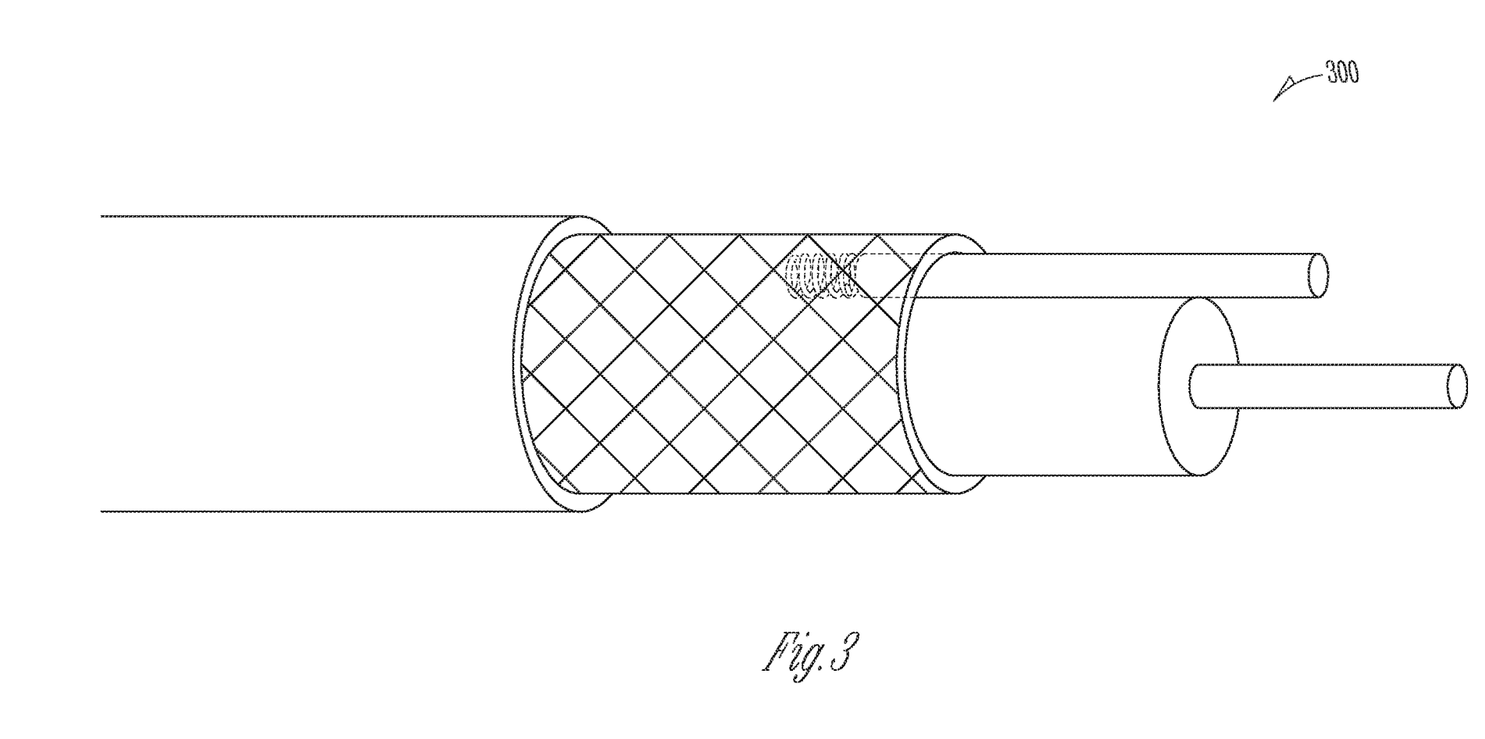
FIG. 3 illustrates a side view of another example of an electrical characterization and fault isolation probe.

FIG. 3 illustrates a side view of another example of an electrical characterization and fault isolation probe 300. The electrical characterization and fault isolation probe 300 (hereinafter "the probe 300") can include similar parts and components as the probe 200. The probe 300 can use similar operating characteristics as the probe 200. The probe 300 can include a cable 330. The cable 330 can include a first conductor 355A, a second conductor 355B, and a dielectric portion 355C. The first conductor 355A can be a wire. The first conductor 355A can be an electrode. The first conductor 355A can have a first impedance. The second conductor 355B can be a wire. The second conductor 355B can be a plurality of wires. The plurality of wires can be interwoven into a braided shield. The second conductor 355B can be an electrode. The second conductor 355B can have a second impedance. A connector (not shown) can be disposed on the end of the cable 330 opposite the third conductor 355D. The connector (e.g., the connector 220 of FIG. 2) can have a third impedance.

A third conductor 355D can be configured to couple with the second conductor 355B. The third conductor 355D can have a fourth impedance. The third conductor 355D can be an electrode. The third conductor 355D can be physically compliant such that the third conductor 355D is configured to translate in relation to the first conductor 355A. The third conductor 355D can be spring-loaded such that the third conductor 355D retracts, or translates, in response to an applied force.

The first impedance, the second impedance, the third impedance, and the fourth impedance can be equal. The first impedance, the second impedance, the third impedance, and the fourth impedance can be substantially similar (e.g., within 1% of one another). The first impedance, the second impedance, the third impedance, and the fourth impedance can be similar (e.g., within 10%). Configuring the first impedance, the second impedance, the third impedance, the fourth impedance to be equal, substantially similar, or similar can reduce the amount of signal degradation, signal loss, reflections, or the like when the probe 300 is used to test devices.

As discussed herein, spring-loading the third conductor 355D can simplify operation of the probe 300 by allowing an individual to test a device with features of varying heights. Spring-loading the third conductor 355D can simplify operation of the probe 300 by allowing an individual to orient the probe 300 in one or more orientations while testing a device. The ability to orient the probe 300 in one or more orientations can allow for an individual to maneuver the probe 300 in tight spaces, or test multiple features that are spaced apart at different distances. In an example, the probe 300 can be angled relative to a device and the first conductor 355D can be brought into contact with a first feature (such as a channel within an interposer). The spring-loaded third conductor 355D can be brought into contact with additional features (while the first conductor remains in contact with the first feature) located at varying distances from the first feature, due to the probe 300 being angled and the third conductor 355D being spring-loaded.

The features that the probe 300 (or the probe 200) can be used to test can include grounding planes, traces, interconnects, vias, packages, integrated circuits (e.g., die), ball grid arrays, embedded multichip interconnect bridges, package on packages, memory, cables, textiles configured to generate an electrical current when moved, wire bonds, or the like.

FIG. 4 illustrates a schematic view of an example of an electrical characterization and fault isolation system 400, including a first collar 450 and a signal generator 410. The electrical characterization and fault isolation system 400 (hereinafter "the system 400") can include a cable 430 and a connector 420. The cable 430 can use similar operating characteristics as the cable 230 or the cable 330. The cable 430 can include a first conductor 455A and a second conductor (not shown). The first conductor 455A can have a first impedance. The second conductor can have a second impedance. The connector 420 can use similar operating characteristics as the connector 220 or the connector 320. The connector 420 can have a third impedance. The system 400 can include an electrical characterization and fault isolation probe 460. The electrical characterization and fault isolation probe 460 (hereinafter "the probe 460") can include the cable 430 and the connector 420. The probe 460 can include similar parts to the probe 200 or the probe 300. The probe 460 can use similar operating characteristics as the probe 200 or the probe 300.

The probe 460 can be configured to mate with the first collar 450. The first collar 450 can include a cavity 454 configured to receive the probe 460 and mate the probe 460 with the collar. The cavity 454 can be configured to receive the cable 430 and mate the cable 430 with the first collar 450. The cavity 454 can be tapered such that the diameter decreases as the depth of the cavity 454 increases. Tapering the cavity 454 can provide an interference fit with the cable 430 (or the probe 460).

The first collar 450 can be configured (e.g., including a through hole from the cavity 454 to the exterior of the first collar 450) to allow the first conductor 455A to translate through the collar after the cable 430 is mated with the cavity 454 of the first collar 450. The first conductor 455A can extend from the first collar 450 when the cable 430 is mated with the first collar 450.

Although the first conductor 455A can translate through, and protrude from, the first collar 450, the present subject matter is not so limited. As discussed herein, the first collar 450 can be interchangeable, or configured to be removable from the cable 430. The first collar 450 can include a fourth conductor (not shown). The fourth conductor can protrude from the first collar 450. The fourth conductor can be rigid. The fourth conductor can have a fifth impedance. In an example, the first conductor 455A is included in the cable 430. In one example, the first conductor 455A extends through the first collar 450. In another example, mating the first collar 450 with the cable 430 can establish an electrical communication pathway between the first conductor 455A and the fourth conductor extends from the first collar 450. Stated another way, the first conductor 455A can translate through, and protrude from, the first collar 450; or mating of the cable 430 with the first collar 450 can interconnect the first conductor 455A of the cable 430 with a fourth conductor that protrudes from the first collar 450.

The first impedance, the second impedance, the third impedance, the fourth impedance, and the fifth impedance can be equal. The first impedance, the second impedance, the third impedance, the fourth impedance, and the fifth impedance can be substantially similar (e.g., within 1% of one another). The first impedance, the second impedance, the third impedance, the fourth impedance, and the fifth impedance can be similar (e.g., within 10%). Configuring the first impedance, the second impedance, the third impedance, the fourth impedance, and the fifth impedance to be equal, substantially similar, or similar can reduce the amount of signal degradation, signal loss, reflections, or the like when the system 400 is used to test devices.

The first collar 450 can include a third conductor. The third conductor 455D can be physically compliant. The third conductor 445D can have a fourth impedance. In an example, mating the first collar 450 with the cable 430 can establish an electrical communication pathway between the second conductor (not shown) and the third conductor 455D.

The first collar 450 can be configured to be removable from the cable 430 after the first collar 450 is mated with the cable 430. Configuring the first collar 450 to be removable can allow for the first collar 450 to be interchanged with other collars (e.g., the second collar 550 of FIG. 5). The first collar 450 can have a first pitch. Other collars can have a second pitch. The first pitch can be different than the second pitch. Other collars can each have a different pitch that is different from the first pitch. Providing interchangeable collars can reduce the amount of time required to test a device under testing, such as by simplifying the process for testing features with varying spaces between the features. Providing interchangeable collars can reduce costs for operating the system 400, such as by removing the need to use expensive probe tips (e.g., probe tip 150 of FIG. 1). The combination of interchangeable collars and a spring-loaded conductor can reduce the number of components needed to test a wide variety of devices, such as by allowing a fewer number of components to test the same number and types of features.

The signal generator 410 can be configured to couple with the connector 420. The signal generator 410 can be configured to generate a first signal. The signal generator 410 can propagate the first signal across the first conductor 455A of the cable 430. The signal generator 410 can receive the first signal from the second conductor of the cable 430. A device under testing (e.g., the device under testing 600 of FIG. 6) can transform the first signal into a second signal. The signal generator 410 can receive the second signal from the second conductor of the cable 430. The signal generator 410 can be configured to use time domain reflectometry to determine the presence, or location, of a fault within the device. The time domain reflectometry can be analog or digital. The signal generator 410 can be configured to use time domain transmission to determine the presence, or location, of a fault within the device. The signal generator 410 can be configured to use vector network analysis to determine the presence, or location, of a fault within a device.

Figure 5:
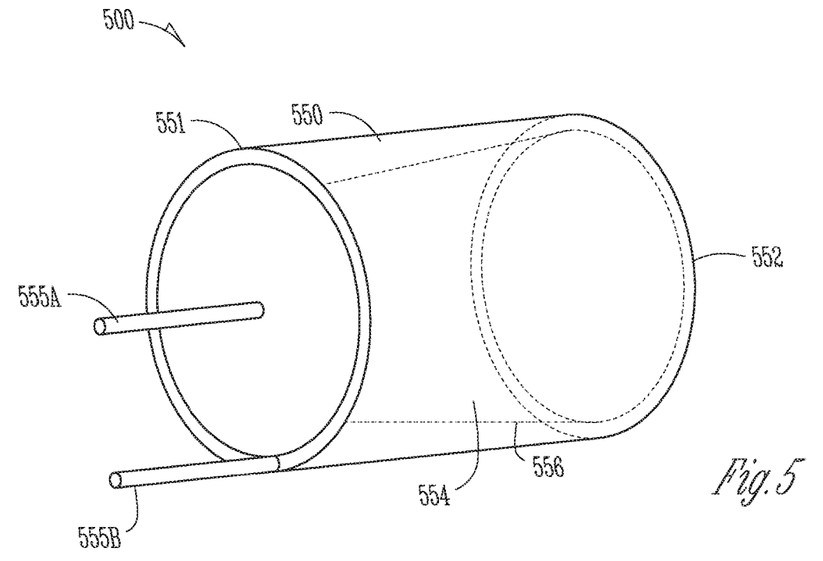
FIG. 5 illustrates a schematic view of an example of a second collar.

FIG. 5 illustrates a schematic view of an example of a second collar 550. The second collar 550 can include parts similar to the first collar 450 of FIG. 4. The second collar 550 can use similar operating characteristics as the first collar 450 of FIG. 4. The second collar 550 can be an adaptor configured to couple with a first collar (e.g., the first collar 450 of FIG. 4). The second collar 550 can include a cavity 554. As shown in FIG. 5, the cavity 554 can include a tapered portion 556. The tapered portion 556 can cause a diameter of the cavity 554 to reduce from a second end 552 of the second collar 550 to a first end 551 of the collar. The tapered portion 556 can allow for an interference fit with a portion of a cable (e.g., the cable 230 of FIG. 2).

Figure 6:
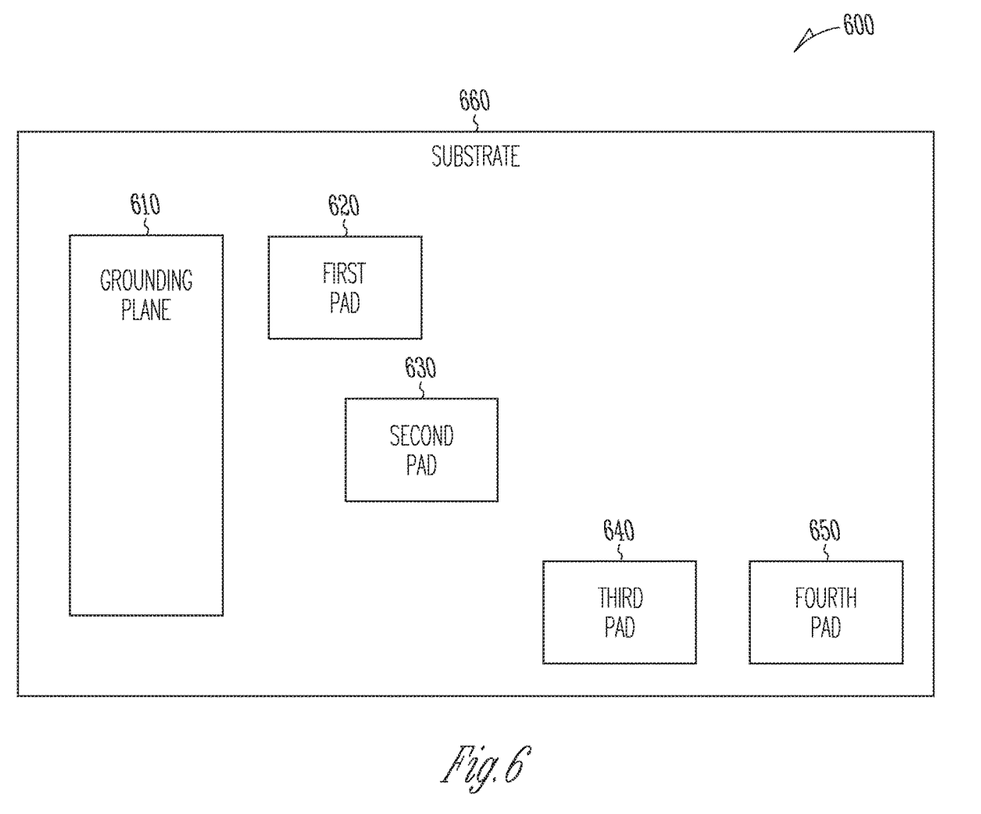
FIG. 6 illustrates a device configured to be tested with an electrical characterization and fault isolation system.

FIG. 6 illustrates a device 600 configured to be tested with an electrical characterization and fault isolation system (e.g., the system 400 of FIG. 4). The device 600 can include a ground plane 610, a first pad 620, a second pad 630, a third pad 640, a fourth pad 650, and a substrate 660. The first, second, third, and fourth pads 620, 630, 640, and 650 can be disposed on the substrate 660.

As discussed herein, a probe (e.g., the probe 200, the probe 300, or the probe 460) can be used to test features of a device (e.g., the device 600) for faults or defects. The probe can include a spring-loaded conductor (e.g., the second conductor 355B of FIG. 3). In an example, the ground plane 610 and the first pad 620 can be offset vertically (e.g., have differing heights). The spring-loaded conductor can allow for an individual to mate the probe with both the ground plane 610 and the first pad 620 without having to expend a substantial amount of effort to angle or otherwise manipulate the probe to bring the probe into contact with both the ground plane 610 and the first pad 620. The spring-loaded conductor allows for the probe to be placed into communication with the first pad 620 and the spring loaded conductor will extend past the first pad 620 and come into communication with the ground plane 610, or vice versa.

Additionally, the spring-loaded conductor can allow for the testing of features that are spaced apart at different distances (e.g., pitches). In an example, the probe can be used to test the ground plane 610 and the first pad 620. Additionally, the probe can be used to test the ground plane 610 and the second pad 630. The probe can be used to test the ground plane 610 and the second pad 630 by angling the probe with respect to the device. Angling the probe can allow for the first conductor of the probe to make contact with the second pad 630 and the ground plane 610 because the spring-loaded conductor will bridge the gap between the ground plane 610 and the second pad 630. Stated another way, the probe is able to simultaneously be in communication with the ground plane 610 and the first pad 620. The probe can then be removed from the ground plane 610 and the first pad 620 and then brought into simultaneous communication with the ground plane 610 and the second pad 630.

The use of an interchangeable collar (e.g., the first collar 450 of FIG. 4 or the second collar 550 of FIG. 5) can allow for the probe to be used to test additional features of the device 600, such as the third pad 640 or the fourth pad 650. In an example, a first collar (e.g., the first collar 450 of FIG. 4) having a first pitch can be used to test between the grounding plane 610 and the first pad 620, or between the grounding plane 610 and the second pad 630. However, the first pitch of the first collar can be too small to test features that are spaced apart greater than the distance between the ground plane 610 and the second pad 630, such as between the grounding plane 610 and the third pad 640 or the fourth pad 650. In an example, a second collar (e.g., the second collar 550 of FIG. 5) having a second pitch can be used to test between the grounding plane 610 and the third pad 640. Additionally, the probe can be reoriented to test between the grounding plane 610 and the fourth pad 650. Additional collars and pitches can be used.

Figure 7:
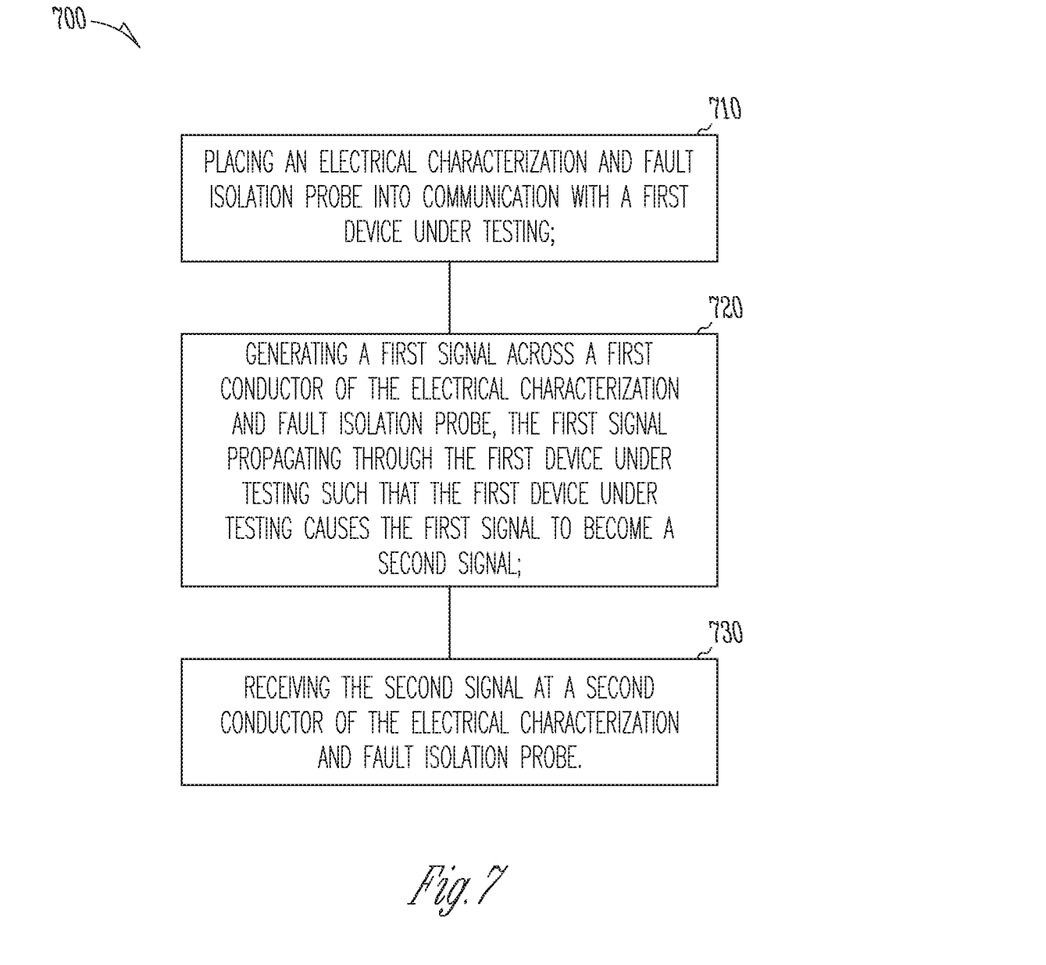
FIG. 7 illustrates a method for using an electrical characterization and fault isolation probe.

FIG. 7 illustrates a method 700 for using an electrical characterization and fault isolation probe (e.g., the probe 200, the probe 300, or the probe 460). The method 700 for using an electrical characterization and fault isolation probe (hereinafter "the method 700") can include at operation 710 placing an electrical characterization and fault isolation probe into communication with a first device under testing. The method 700 can include at operation 720 generating a first signal across a first conductor of the electrical characterization and fault isolation probe, the first signal can propagate through the first device under testing such that the first device under testing causes the first signal to become a second signal. The method 700 can include at operation 730 receiving the second signal at a second conductor of the electrical characterization and fault isolation probe.

The method 700 can also include coupling a first collar (e.g., the first collar 450 of FIG. 4) to the electrical characterization and fault isolation probe, wherein the first collar can be configured to mate with the first device under testing. The method 700 can further include decoupling the first collar from the electrical characterization and fault isolation probe. The method 700 can still further include coupling a second collar (e.g., the second collar 550 of FIG. 5) to the electrical characterization and fault isolation probe, wherein the second collar can be configured to mate with a second device under testing. The second collar can be configured to mate with (e.g., come into communication with) other features of the first device under testing that the first collar cannot mate with, such as due to pitch incompatibility.

VARIOUS NOTES

The above description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An electrical characterization and fault isolation probe, comprising:
    a cable including first and second ends;
    a first conductor having a first impedance;
    a second conductor having a second impedance;
    a dielectric sheathing the first conductor and electrically isolating the first conductor from the second conductor;
    a connector physically coupled to, and in electrical communication with, the cable, wherein:
        the connector includes a first electrical communication pathway and a second electrical communication pathway, wherein:
            the first electrical communication pathway is electrically isolated from the second electrical communication pathway;
            the first electrical communication pathway is in electrical communication with the first conductor;
            the second electrical communication pathway is in electrical communication with the second conductor; and
        the connector has a third impedance;
    a third conductor having a fourth impedance, wherein:
        the third conductor is configured for coupling with the second conductor; and
        the third conductor is physically compliant; and
    a coating over a portion of the cable extending from the first end of the cable toward the second end of the cable.

2. The apparatus of claim 1, wherein the first impedance, second impedance, third impedance, and the fourth impedance are equal.

3. The apparatus of claim 1, wherein the first impedance, second impedance, third impedance, and the fourth impedance are substantially similar.

4. The apparatus of claim 1, wherein the first conductor and the third conductor are spaced apart at a first pitch.

5. The apparatus of claim 1, wherein the first conductor and the third conductor are spaced apart at a second pitch.

6. The apparatus of claim 1, further comprising a collar configured to mate with the cable, wherein the collar includes:
    the third conductor;
    a fourth rigid conductor having a fifth impedance;
    the third conductor and the fourth conductor are spaced apart at a first pitch; and
    wherein mating the collar with the cable establishes an electrical communication pathway between the first conductor and the fourth conductor, and the second conductor and the third conductor, respectively.

7. The apparatus of claim 6, wherein the first impedance, second impedance, third impedance, fourth impedance, and the fifth impedance are equal.

8. The apparatus of claim 6, wherein the first impedance, second impedance, third impedance, fourth impedance, and the fifth impedance are substantially similar.

9. The apparatus of claim 6, wherein the third conductor and the fourth conductor are spaced apart at a second pitch, wherein the second pitch is different than the first pitch.

10. The apparatus of claim 6, further comprising an adaptor configured to couple with the collar, wherein the adaptor includes:
    a fifth conductor in electrical communication with the third conductor, the fifth conductor having a sixth impedance;
    a sixth conductor in electrical communication with the fourth conductor, the sixth conductor having a seventh impedance; and
    the fifth conductor and the sixth conductor are spaced apart at a second pitch, wherein the second pitch is different than the first pitch.

11. The apparatus of claim 10, wherein the first impedance, second impedance, third impedance, fourth impedance, fifth impedance, sixth impedance, and the seventh impedance are equal.

12. The apparatus of claim 10, wherein the first impedance, second impedance, third impedance, fourth impedance, fifth impedance, sixth impedance, and the seventh impedance are substantially similar.

13. An electrical characterization and fault isolation system, comprising:
    an electrical characterization and fault isolation probe, including:
        a cable including first and second ends;
        a first conductor having a first impedance;
        a second conductor having a second impedance;
        a dielectric sheathing the first conductor and electrically isolating the first conductor from the second conductor;
        a connector physically coupled to, and in electrical communication with, the cable, wherein:
            the connector includes a first electrical communication pathway and a second electrical communication pathway, wherein:
                the first electrical communication pathway is electrically isolated from the second electrical communication pathway;
                the first electrical communication pathway is in electrical communication with the first conductor;
                the second electrical communication pathway is in electrical communication with the second conductor; and
            the connector has a third impedance;
        a third conductor having a fourth impedance, wherein:
            the third conductor is configured for coupling with the second conductor; and
            the third conductor is physically compliant and
        a coating over a portion of the cable extending from the first end of the cable toward the second end of the cable;
    a signal generator in electrical communication with the probe configured to transmit a first signal through the probe;
    a signal processing unit in electrical communication with the probe and configured to receive the first signal from the probe and analyze the first signal to determine the location of an electrical fault in a device under testing.

14. The system of claim 13, wherein the presence or location of the electrical fault is determined by using vector network analysis or time-domain reflectometry.

15. The system of claim 14, wherein the device includes an embedded multichip interconnect bridge, an interconnect, a via, a semiconductor package, a die, memory, or a processor.

16. The system of claim 13, further comprising a device under testing, wherein the probe is configured to mate with the device and transmit the first signal to the device.

17. The system of claim 13, further comprising a third conductor configured to be physically compliant and coupled to the second conductor, wherein the third conductor has a fourth impedance.

18. The system of claim 17, wherein the first impedance, second impedance, third impedance, and the fourth impedance are substantially similar.

19. A method for using an electrical characterization and fault isolation probe, comprising:
   placing an electrical characterization and fault isolation probe into communication with a first device under testing, wherein the probe includes:
   a cable including first and second ends;
   a first conductor having a first impedance;
   a second conductor having a second impedance;
   a dielectric sheathing the first conductor and electrically isolating the first conductor from the second conductor;
   a connector physically coupled to, and in electrical communication with, the cable, wherein:
      the connector includes a first electrical communication pathway and a second electrical communication pathway, wherein:
         the first electrical communication pathway is electrically isolated from the second electrical communication pathway;
         the first electrical communication pathway is in electrical communication with the first conductor;
         the second electrical communication pathway is in electrical communication with the second conductor; and
         the connector has a third impedance;
   a third conductor having a fourth impedance, wherein:
      the third conductor is configured for coupling with the second conductor; and
      the third conductor is physically compliant and
   a coating over a portion of the cable extending from the first end of the cable toward the second end of the cable;
   generating a first signal across a first conductor of the electrical characterization and fault isolation probe, the first signal propagating through the first device under testing such that the first device under testing causes the first signal to become a second signal; and
   receiving the second signal at a second conductor of the electrical characterization and fault isolation probe.

20. The method of claim 19, further comprising coupling a first collar to the electrical characterization and fault isolation probe, wherein the first collar is configured to mate with the first device under testing.

21. The method of claim 20, further comprising:
   decoupling the first collar from the electrical characterization and fault isolation_probe; and
   coupling a second collar to the electrical characterization and fault isolation probe, wherein the second collar is configured to mate with a second device under testing.

* * * * *

UNITED STATES PATENT AND TRADEMARK OFFICE
CERTIFICATE OF CORRECTION

| | | |
|---|---|---|
| PATENT NO. | : 11,226,353 B2 | Page 1 of 1 |
| APPLICATION NO. | : 16/493503 | |
| DATED | : January 18, 2022 | |
| INVENTOR(S) | : Hu et al. | |

It is certified that error appears in the above-identified patent and that said Letters Patent is hereby corrected as shown below:

In the Claims

In Column 14, Line 54, in Claim 13, after "compliant", insert --;--

In Column 16, Line 10, in Claim 19, after "compliant", insert --;--

In Column 16, Line 27, in Claim 21, delete "isolation_probe;" and insert --isolation probe;-- therefor Signed and Sealed this
Twelfth Day of July, 2022

Katherine Kelly Vidal
*Director of the United States Patent and Trademark Office*